United States Patent [19]
Cronson

[11] 3,983,416
[45] Sept. 28, 1976

[54] SHORT PULSE SEQUENTIAL WAVEFORM GENERATOR
[75] Inventor: Harry M. Cronson, Lexington, Mass.
[73] Assignee: Sperry Rand Corporation, New York, N.Y.
[22] Filed: Dec. 30, 1974
[21] Appl. No.: 537,237

[52] U.S. Cl. .............................. 307/260; 307/281; 307/319; 328/56; 328/59; 333/20
[51] Int. Cl.² ...................... H03K 4/00; H03K 3/33
[58] Field of Search ........... 307/281, 319, 320, 260, 307/261, 263, 264, 220 R, 106; 328/56, 38, 59; 333/20

[56] References Cited
UNITED STATES PATENTS
3,001,137  9/1961  Kassel et al. ......................... 328/56
3,311,750  3/1967  Bartik ................................. 307/261
3,418,604  12/1968 Ross .................................... 328/56
3,609,404  9/1971  Uchida ................................ 307/319

OTHER PUBLICATIONS
"Improving Pulse Rise Time with Snap-Off Diodes" by Hu. in Electronics, Feb. 15, 1963, pp. 68-70.

Primary Examiner—Stanley D. Miller, Jr.
Attorney, Agent, or Firm—Howard P. Terry; Thomas J. Scott

[57] ABSTRACT
A sequence of short pulses are produced from a single input pulse of longer duration by use of a plurality of step recovery diodes connected in shunt across a transmission line. The number of individual pulses produced in response to each applied longer pulse is determined by the number of step recovery diodes shunting the transmission line and the distance between adjacent pulses in the sequence is determined by the spacing between the diodes producing the adjacent pulses.

9 Claims, 3 Drawing Figures

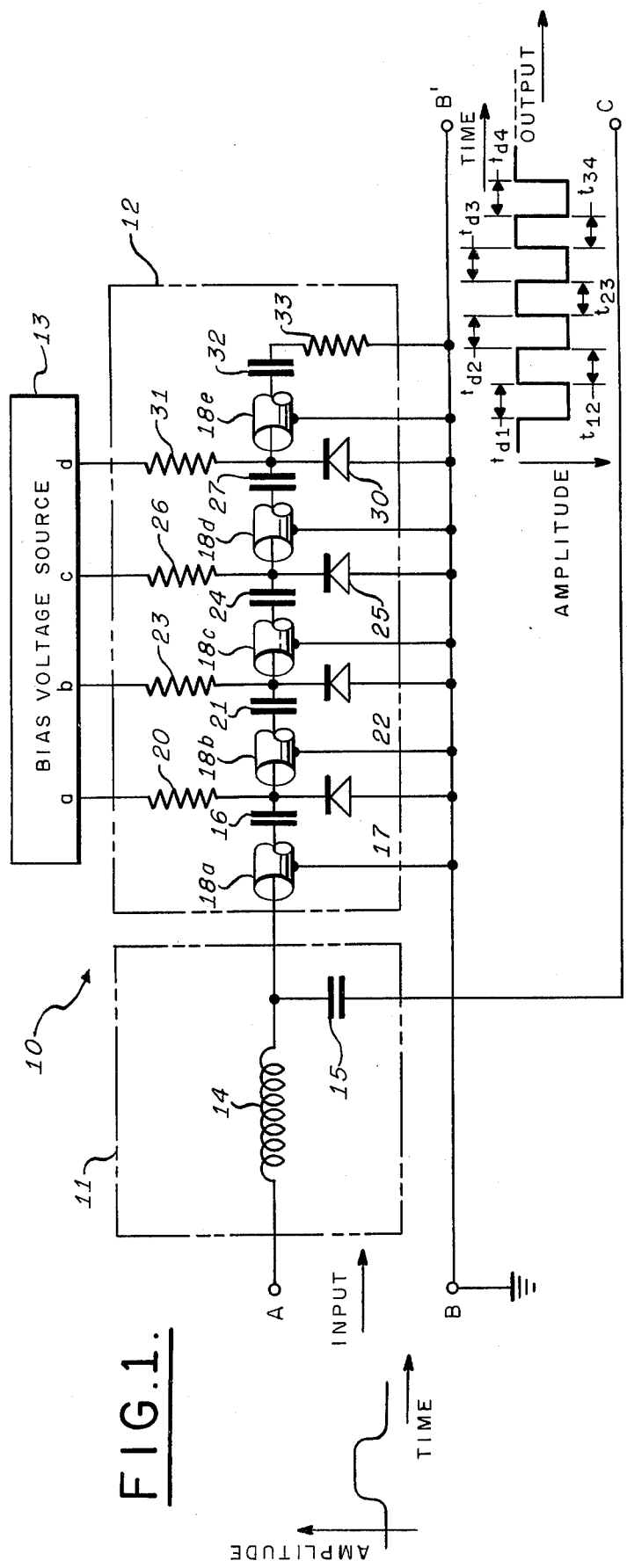
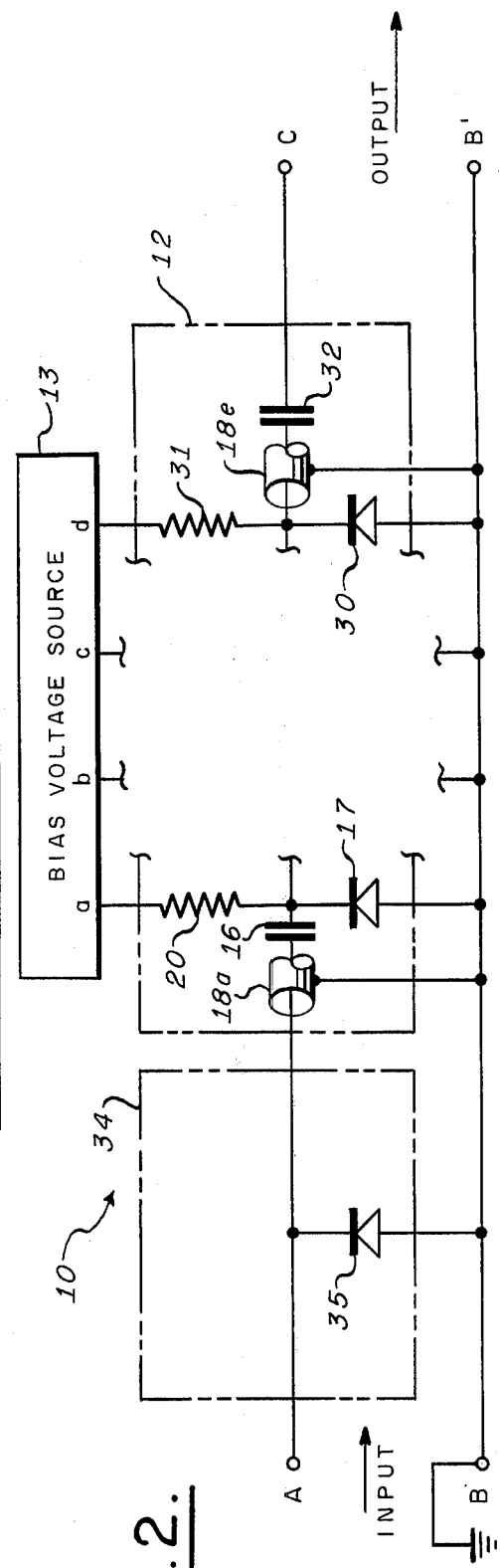
FIG.1.
FIG.2.

SHORT PULSE SEQUENTIAL WAVEFORM GENERATOR

BACKGROUND OF THE INVENTION

1. Field of the Invention

The invention pertains to apparatus for generating a sequential pulse train of high frequency electromagnetic signals having a duration on the order of one nanosecond or less and specifically to generators in which the output pulse sequence and the pulse width of the individual pulses can be controlled electronically without mechanically modifying the structure of the apparatus.

2. Description of the Prior Art

U.S. Pat. No. 3,612,899 entitled "Generator For Short-Duration High Frequency Pulse Signals", issued on Oct. 12, 1971 in the names of G. F. Ross et al and assigned to the assignee of the subject application, discloses a pulse forming network which includes open and shorted stubs for furnishing a few short pulses from a longer pulse or one short pulse. The usefulness of this prior art apparatus decreases as the desired number of individual pulses increases because the amplitude of the output pulse decreases with the number of junctions so that for N junctions the output pulse is decreased by $2^{-N}$. Furthermore, since the pulse forming network is passive, the spectral density in the output pulses must always remain equal to or less than the spectral density of the input pulse. In addition, each desired sequence of pulses requires a separate pulse forming network so that a change in the desired sequence of pulses can only be produced by replacing the pulse forming network.

U.S. Pat. No. 3,484,619 entitled "Radio Frequency Generators", issued on Dec. 16, 1969 in the name of J. M. Proud, Jr. and assigned to Ikor Inc. teaches an apparatus for producing pulse sequences from a plurality of transmission line segments separated by a series of spark gaps which are operated as switches. This spark gap device is used exclusively for generating very high power levels on the order of 20 kV which is impractical for use in applications requiring lower voltage levels. In addition, the individual pulse widths may only be adjusted by the time consuming process of altering the electrode spacing or the gas pressure and the output sequence of pulses can only be altered by mechanically replacing the actual hardware comprising the transmission line segments.

U.S. Pat. No. 3,832,568, entitled "Circuit For Generating A Single High Voltage Subnanosecond Baseband Pulse", issued on Aug. 15, 1974 in the name of C. C. Wang and assigned to the same assignee as the subject application, discloses a circuit including a step recovery diode for producing a single subnano-second baseband pulse in response to a longer duration pulse input.

BRIEF DESCRIPTION OF THE DRAWINGS

FIG. 1 is a schematic diagram of a short pulse sequential waveform generator incorporating an input-/output circuit comprised of an inductive-capacitive circuit;

FIG. 2 is a schematic diagram of a short pulse sequential waveform generator incorporating an alternate form of output circuit.

SUMMARY OF THE INVENTION

Figure 3:
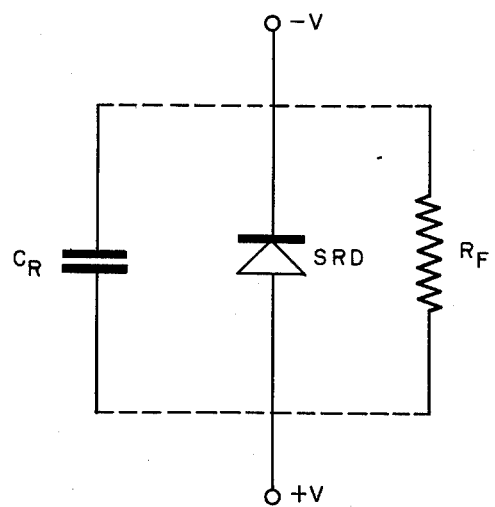
FIG. 3 is a schematic diagram of an equivalent circuit for a step recovery diode.

The invention is a solid state device capable of generating a sequence of short pulses, i.e., pulses having widths less than one nanosecond. The device includes a generator circuit comprising a transmission line having a plurality of stages coupled in parallel across the transmission line. Each stage includes a step recovery diode coupled to a d.c. blocking capacitor and a bias limiting resistor to provide individual adjustment to the characteristics of each stage. Each bias limiting resistor is coupled to a source of bias supply voltage. The transmission line further includes a terminating resistor coupled to the last stage through a d.c. blocking capacitor.

An input pulse having a duration greater than the sum of all the individual pulse widths of the pulses to be produced is applied to the input of the generator circuit. In response to the applied input pulse the generator circuit will produce a plurality of subnanosecond pulses having pulse widths and spacings between the pulses determined from the individual characteristics of the components in each stage and the value of the bias voltage coupled to the step recovery diode in each stage.

The pulse sequence may be adjusted to simulate a radio frequency burst of energy, as a linear FM modulator, a pseudo-random signal generator or a variable word generator for testing gigabit digital components.

The disclosed short pulse sequential waveform generator is an improvement over the prior art devices described above because it provides means for producing a sequence of short pulses in which the characteristics, i.e., pulse width and the spacing between the individual pulses may be controlled electronically without physically replacing or mechanically modifying the components comprising the device. In addition, the disclosed device provides gain with individual pulse risetimes less than the input risetime.

DESCRIPTION OF THE PREFERRED EMBODIMENT

FIG. 1 shows a short pulse sequential waveform generator 10 including an input-output circuit 11, a generator circuit 12 and a bias voltage source 13 for the generator circuit 12. The waveform generator circuit 10 has input terminals A and B and output terminals B'C. Terminals B and B' are connected to ground. The input terminal A is coupled to the first terminal of an inductor 14 which has its second terminal connected to an output coupling capacitor 15 and the input of a first section 18a of a high frequency transmission line 18 which may be comprised of a plurality of lengths of coaxial line. The first terminal on a d.c. blocking capacitor 16 in the generator circuit 12 is connected to the output of the first section 18a of the line 18. The second terminal on the output coupling capacitor 15 is connected to the output terminal C.

In the generating circuit 12 the second terminal on the capacitor 16 is connected to the cathode of a step recovery diode 17 and the first terminal on a bias limiting resistor 20 which has its second terminal connected to a terminal a in the bias voltage source 13. The anode of the step recovery diode 17 is connected to ground. The first line section 18a in combination with the capacitor 16 and the step recovery diode 17 and resistor 20 comprise the first stage of the generating circuit 12. The second stage of the generating circuit 12 includes a second section 18b of the line 18 having its first terminal connected to the junction between the capacitor 16, the diode 17 and the resistor 20. The second terminal of the second section 18b is connected to the first terminal on a d.c. blocking capacitor 21 which has its second terminal connected to the cathode of a step recovery diode 22 and the first terminal on a resistor 23 which has its second terminal connected to a terminal b in the bias voltage source 13.

The third stage of the generating circuit 12 includes a third section 18c of the line 18 having its first terminal connected to the junction of the capacitor 21, step recovery diode 22 and the resistor 23. The second terminal of the third section 18c is connected to the first terminal on a d.c. blocking capacitor 24 which has its second terminal connected to the cathode on a step recovery diode 25 and the first terminal on a bias limiting resistor 26 which has its second terminal connected to a terminal c on the bias voltage source 13.

The fourth stage of the generating circuit 12 includes a fourth section 18d of the line 18 having its first terminal connected to the common junction between the capacitor 24, the step recovery diode 25 and the resistor 26. The second terminal of the fourth section 18d is connected to the first terminal on a d.c. blocking capacitor 27 which has its second terminal connected to the cathode of the step recovery diode 30 and the first terminal on the bias limiting resistor 31 which has its second terminal connected to a terminal d on the bias voltage source 13. The anodes of the step recovery diodes 17, 22, 25 and 30 are all connected to the common ground for the terminals B and B'.

The common junction between the capacitor 27, the step recovery diode 30 and the resistor 31 is coupled to a fifth section 18e of the line 18 which has its second terminal connected to the first terminal on a coupling capacitor 32. The second terminal on the capacitor 32 is connected to the first terminal on a terminating resistor 33 which has its second terminal connected to the common ground for terminals B and B'. Although four stages are shown, any other number may also be used.

A step recovery diode can be idealized to be thought of as a fast acting switch which during its conducting period, i.e., when it is forward biased, has sufficient charge stored in the intrinsic, I, region of the diode so that it acts as a short-circuit with a very low forward resistance which may be designated $R_F$. This is shown in FIG. 3 by the resistor $R_F$ connected across the step recovery diode by the dotted lines. An incident positive pulse applied to the cathode of the step-recovery diode will be reflected as a negative pulse until all the charge is withdrawn. After the charge is withdrawn the step-recovery diode suddenly turns into an insulator having only a small capacitance designated $C_R$ in FIG. 3 which is connected across the step recovery diode by the dotted lines. When the charge stored in the I region of the diode is depleted, the diode changes state producing two positive steps which travel in opposite directions away from the diode. The first positive step follows the negative step and cancels the original negative reflected step for all times in which $t > t_{dl}$ so that the net reflection from the diode is a negative pulse having a pulse width $t_{dl}$.

In operation an input pulse as shown to the left of FIG. 1 is applied across the input terminals A, B of the circuit 11 which couples the applied input pulse into the first stage of the generating circuit 12 comprised of the first section 18a of the line 18, the capacitor 16, diode 17 and resistor 20. The diode 17 is initially forward biased through the resistor 20 by the bias voltage source 13. Thus the step-recovery diode 17 initially carries current in the forward direction and appears like a short circuit across the transmission line. Likewise the diodes 22, 25, and 30 are also forward biased through their associated bias resistors and the bias voltage source 13. Therefore each of these step recovery diodes has a finite amount of charge and appears as a short circuit across the transmission line.

The application of the positive input pulse at the cathode of the diode 17 withdraws the stored charge until the diode abruptly changes state from low impedance, i.e., conducting, to high impedance, i.e., nonconducting thereby producing a negative pulse which is reflected back to the input of the line 18. The time from the arrival of the incident positive pulse to the state change of the diode 17 is designated the charge depletion time, $t_d$, and is a function of the characteristics of the particular diode employed, the bias voltage applied to the cathode of the diode, the amplitude and shape of the input pulse, and the ambient temperature. The charge depletion time for this first step recovery diode 17 is designated $t_{dl}$ and is the width of the negative pulse reflected by the step recovery diode in response to the applied input pulse. This reflected negative pulse is coupled from the step recovery diode 17 through the capacitor 16 and the first section of the line 18a to the junction of the inductive coil 14 and output capacitor 15. These latter components function as a filter which separates the low frequency applied input pulse from the high frequency output pulse which is coupled through the output capacitor 15 as the first pulse in the sequential output waveform.

When the step recovery diode 17 changes state from conducting to non-conducting, two positive steps are produced which travel away from the junction of the capacitor 16, diode 17, resistor 20 and line 18b. The positive step coupled through the capacitor 16 cancels the portion of the original negative reflected step produced during the withdrawal of stored charge from the diode 17 for the duration of time in excess of the depletion time of the first step recovery diode 17, i.e., $t_{dl}$. As a result, the net reflection from step recovery diode 17 is a negative pulse having a pulse width $t_{dl}$ and this pulse is the first pulse in the sequential waveform.

The second positive step which is produced simultaneously with the first positive step by the step recovery diode 17 is coupled through the second section 18b of the transmission line 18 and the capacitor 21 to the cathode of the diode 22 which is initially forward biased. The positive input step at the cathode of the diode 22 withdraws the stored charge in a similar manner to that described above with respect to diode 17 until the diode 22 abruptly changes state from low impedance to high impedance thereby producing a negative pulse which is reflected back through capacitor 21, the second section of line 18b, capacitor 16, the first section of line 18a to the junction of the inductor 14 and the capacitor 15.

The time from the trailing positive going edge of the first output pulse to the leading negative going edge of this second output pulse is designated $t_{12}$ which has a value equal to $2L_{12}/v$, where $L_{12}$ is the length of the second segment 18b of the transmission line 18 between the diode 17 and the capacitor 21 and $v$ is the propagation velocity of the pulse.

The diode 22 will remain in the low impedance state until the time $t_{d2}$ after the arrival of the positive step at the cathode of the diode 22. When the diode 22 changes state from low impedance to high impedance two positive steps will be produced which will travel away from the junction of the capacitor 21, diode 22, resistor 23 and the third section of line 18c in the same manner as described with respect to step recovery diode 17. The process for producing the first and second output pulses in the sequential output waveform described with respect to the first and second stages is common to all of the following stages including the last step recovery diode 30. This diode produces a second positive step output which is coupled through the last segment of transmission line 18e, the coupling capacitor 32 to the terminating resistor 33 where it is completely absorbed.

The total reflected waveform is determined by summing all the reflected pulses coupled through the coupling capacitor 15 to the output terminals B', C to provide the sequential output waveform shown in FIG. 1.

The sequential output waveform may be modified by controlling the individual bias voltages applied to each stage of the generator circuit 12. For example, if the bias voltage coupled to step recovery diode 22 is reduced to zero, i.e., $t_{d2} = 0$, then the leading negative going edge of the negative step from the diode 25 will follow the positive going trailing edge of the first negative pulse from the diode 17 by a time $t' = 2(L_{12} + L_{23})/v$.

In an actually constructed embodiment of the subject invention the generator circuit 12 included three Hewlett-Packard 5082-0365 step recovery diodes, each separated approximately by 1.95 inches in a 50-ohm microstrip configuration. Each d.c. blocking capacitor corresponding to capacitors 16, 21, 24 had a capacitance of $10^3$ picofarads, each bias resistor corresponding to resistors 20, 23 and 26 had an impedance of 910 ohms and the terminating resistor corresponding to resistor 33 had an impedance of 50 ohms.

In the preferred embodiment shown in FIG. 1 the input-output circuit 11 is comprised of the inductor 14 and the coupling capacitor 15. In this combination the inductance 14 acts as a low-pass element which allows the applied input pulse to be coupled into the generator circuit 12 but blocks the higher frequency reflected waveform from traveling to the input terminal A. Whereas the capacitor 15 functions as a high-pass element which keeps the low frequency applied input signal from being coupled to the output terminals C and only produces minimal attenuation of the reflected output waveform being coupled to the output terminal C. This input-output circuit proved quite effective in efficiently separating the applied input pulse from the resulting waveform in an actual embodiment of the invention.

An alternate form of input-output circuit configuration is shown in FIG. 2 in which the input is coupled to an input circuit 34 comprised of an unbiased step recovery diode 35 which has its cathode coupled to the input terminal A and its anode coupled to the grounded input terminal B. An applied positive input signal is coupled to the first section of line 18a with minimal reflection by the diode 35. However, each negative reflected signal produced by each of the step recovery diodes in response to the applied positive input pulse will have the proper polarity to cause the diode 35 to conduct and be almost entirely reflected back through the generator circuit 12 to the output terminals C, B'.

In order to employ this alternate configuration of input device 34, the width of the input pulse, $T_i$, must be of sufficiently short duration to insure that part of the input pulse is not at the diode 35 at the time the reflected negative pulse signal arrives. Otherwise the total voltage on the input line will not become negative. Therefore for proper output operation, the condition to be satisfied is $T_i < 2L_{ol}/v$, where $L_{ol}$ is the distance between the diode 35 and the diode 17 in the first stage of the generator circuit 12.

In the actually constructed embodiment of the subject invention the sequential output waveform was comprised of a plurality of pulses having pulse widths less than 1 nanosecond and amplitudes greater than 10 volts in which the individual pulse widths were varied electrically by changing the bias voltage applied to the individual step recovery diodes in the generator circuit 12.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. An apparatus for providing a sequence of short pulses in response to an applied input pulse of a predetermined pulse width and a predetermined rise time, said apparatus comprising transmission line means for dispersionless propagation including a plurality of sections and a terminating section, a plurality of stages each including a section of said transmission line means and semiconductor means connected in shunt across said section of said transmission line means wherein each of said semiconductor means stores charge therein when forward biased and produces a first step voltage in response to an incident step voltage and produces a second step voltage when said stored charge is depleted, bias voltage means coupled to each of said semiconductor means for providing forward bias voltage to each of said semiconductor means, impedance means coupled to said terminating section of said transmission line means, and input means coupled to said transmission line means for coupling said applied input pulse to the first of said plurality of stages and each stage produces an output pulse formed from said first and second step voltage thereby forming a sequence of short pulses wherein the number of short pulses is proportional to the number of semiconductor means in said plurality of stages, the sum of the pulse widths of said short pulses in the sequence is less than the pulse width of the applied input pulse and the rise time of each of said short pulses is less than the rise time of the applied input pulse.

2. An apparatus as recited in claim 1 in which said bias voltage means includes means for varying the pulse width of each short pulse in the output pulse sequence.

3. An apparatus as recited in claim 1 in which said bias voltage means further includes means for reducing the number of short pulses in the output pulse sequence.

4. An apparatus as recited in claim 1 in which said semiconductor means included in each stage includes step recovery diodes.

5. An apparatus as recited in claim 4 in which said bias voltage means includes a bias voltage source coupled through bias resistors to the cathodes of step recovery diodes.

6. An apparatus as recited in claim 1 in which each of said plurality of stages further includes capacitive means coupled between the input of each stage and semiconductor means.

7. An apparatus as recited in claim 1 in which said lengths of said transmission line means are selected in accordance with the desired separation between said short pulses in said sequence of short pulses.

8. An apparatus as recited in claim 1 in which said input means includes an inductive-capacitive filter means for separating the applied input pulse from the sequence of short pulses.

9. An apparatus as recited in claim 1 in which said input means includes a step recovery diode connected in shunt across said transmission line means and said applied input pulse has a pulse width $T_i < 2L_{ol}/v$ where $L_{ol}$ is the distance between said step recovery diode in said input means and the first semiconductor means in the first of said plurality of stages.

* * * * *